(12) United States Patent
Smith et al.

(10) Patent No.: US 6,342,446 B1
(45) Date of Patent: Jan. 29, 2002

(54) PLASMA PROCESS FOR ORGANIC RESIDUE REMOVAL FROM COPPER

(75) Inventors: Patricia B. Smith, Colleyville; Antonio L. P. Rotondaro, Dallas, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/407,418

(22) Filed: Sep. 29, 1999

Related U.S. Application Data
(60) Provisional application No. 60/103,455, filed on Oct. 6, 1998.

(51) Int. Cl.[7] .............................................. H01L 21/44
(52) U.S. Cl. ...................... 438/687; 438/683; 438/685; 438/686; 438/688
(58) Field of Search .................................. 438/685, 686, 438/687, 688, 683, 710, 725

(56) References Cited

U.S. PATENT DOCUMENTS 6,071,813 A * 6/2000 Nogami ...................... 438/687
6,017,192 A * 8/2000 Subrahmanyan et al. ... 438/637

* cited by examiner

*Primary Examiner*—Alexander G. Ghylka
(74) *Attorney, Agent, or Firm*—W. James Brady, III; Frederick J. Telecky, Jr.

(57) ABSTRACT

An embodiment of the instant invention is a method of fabricating an electronic device formed on a semiconductor wafer, the method comprising the steps of: forming a conductive structure over the semiconductor substrate, the conductive structure comprised of an oxygen-sensitive conductor and having an exposed surface; oxidizing a portion of the conductive structure (step 313 of FIG. 1); and subjecting the conductive structure to a plasma which incorporates hydrogen or deuterium (step 315 of FIG. 1).

4 Claims, 5 Drawing Sheets

PLASMA PROCESS FOR ORGANIC RESIDUE REMOVAL FROM COPPER

CROSS-REFERENCE TO RELATED PATENT/PATENT APPLICATIONS

This application claims benefit of No. 60/103,455 filed Oct. 6, 1998.

The following commonly assigned patent/patent applications are hereby incorporated herein by reference:

| U.S. Pat. No. /Ser. No. | Filing Date | TI Case No. |
| --- | --- | --- |
| 09/199,600 | 11/25/98 | TI-26189 |
| 09/199,829 | 11/25/98 | TI-25250 |
| 09/408,022 | 09/29/99 | TI-27638 |

FIELD OF THE INVENTION

The instant invention pertains to semiconductor device fabrication and processing and more specifically to post metal pattern and etch clean-up processing.

BACKGROUND OF THE INVENTION

Most semiconductor devices utilize several different levels of metallization. With the increasing complexity of devices and the need to reduce the physical size of devices, the number of levels which incorporate metal connections is increasing. In addition, with the desire to increase the speed of the devices while reducing the power consumed by the devices, advanced metallization schemes are being developed. One such scheme involves the use of copper-doped aluminum or copper structures for the bus lines and interconnects. Additionally, interlevel dielectrics with lower dielectric constants than standard silicon dioxide films may be used as the dielectric material situated between metallic structures.

A problem that most semiconductor manufacturers face is the cleaning up of the metallic structures after the structures are patterned and etched. More specifically, the photoresist needs to be removed, and the residual metal halide etch byproducts have to be removed or converted to different chemical forms to avoid corrosion of the metal. These processes, commonly known as strip and passivation processes, may cause non-conducting residues to form on the metallic structure. In order to address this problem, a cleaning step is typically performed after the underlying metal structure is exposed and the photoresist is removed. The cleanup step will preferably remove all of the residue, typically comprised of polymers, that are formed on the metal structure, thus inhibiting corrosion of the metal structures. However, the clean step must not appreciably affect the electrical critical dimension (CD) of the metal structure.

For a typical Cu metallization scheme, a standard $H_2$ plasma strip process (see co-pending patent application Ser. No. 09/199,829, TI-25250, assigned to Texas Instruments) is performed to remove photoresist after a via oxide etch process. Since a photoresist strip with $O_2$ plasma causes substantial oxidation to any exposed Cu at the bottom of the via, this approach is generally not used. This is so even though a $Si_3N_4$ barrier layer is present, and the via etch process completes to the $Si_3N_4$ layer, without passing through the $Si_3N_4$ layer. The nitride layer must then be removed in a separate wet or dry etch process. Thus, a dry plasma etch process which could be used to remove photoresist without oxidation of Cu would simplify the process flow by either eliminating the need for the $Si_3N_4$ barrier layer, or substantially thinning it (it might still be useful as an etch stop layer for via formation). Removal or thinning of the $Si_3N_4$ barrier layer would ease the oxide etch selectivity requirements since stopping the etch on the $Si_3N_4$ layer would not be necessary.

SUMMARY OF THE INVENTION

An embodiment of the instant invention is a method of fabricating an electronic device formed on a semiconductor wafer, the method comprising the steps of: forming a conductive structure over the semiconductor substrate, the conductive structure comprised of an oxygen-sensitive conductor and having an exposed surface; oxidizing a portion of the conductive structure; and subjecting the conductive structure to a plasma which incorporates hydrogen or deuterium. The step of oxidizing a portion of the conductive structure may result in the conductive structure being more resistive, and the step of oxidizing a portion of the conductive structure may include oxidizing the exposed portion of the conductive structure. The step of subjecting the conductive structure to a plasma which incorporates hydrogen or deuterium may result in the oxidized conductive structure becoming more conductive than it was in its oxidized state. Preferably, the oxygen-sensitive material is comprised of: copper, tantalum, tantalum nitride, titanium, titanium nitride, titanium silicide, tungsten, tungsten nitride, tungsten silicide, aluminum, copper-doped aluminum, silver, gold, ruthenium, ruthenium oxide, iridium, platinum, cobalt, cobalt silicide, and any combination thereof.

Another embodiment of the instant invention is a method of fabricating an electronic device formed on a semiconductor wafer, the method comprising the steps of: forming a conductive structure over the substrate, the conductive structure comprised of an oxygen-sensitive conductor; forming a layer of dielectric material over the conductive structure; forming a photoresist layer over the layer of the dielectric material; patterning the layer of the dielectric material; removing the photoresist layer after patterning the layer of the dielectric material; subjecting the semiconductor wafer to a plasma which incorporates oxygen and a substance selected from the group consisting of: $CF_4$, $C_2F_6$, $CHF_3$, $CFH_3$, another fluorine-containing hydrocarbon, and any combination thereof; and reducing oxides formed in the conductive structure by subjecting the semiconductor wafer to a plasma which incorporates a gas which includes hydrogen or deuterium. In an alternative embodiment, the step of removing the photoresist layer is performed by subjecting the semiconductor wafer to the plasma which incorporates a gas which includes hydrogen or deuterium. Preferably, the plasma also includes $NH_3$, $N_2H_2$, $H_2S$, $CH_4$ or deuterated forms of these gases. The oxygen-sensitive material is, preferably, comprised of: copper, tantalum, tantalum nitride, titanium, titanium nitride, titanium silicide, tungsten, tungsten nitride, tungsten silicide, aluminum, copper-doped aluminum, silver, gold, ruthenium, ruthenium oxide, iridium, platinum, cobalt, cobalt silicide, and any combination thereof.

Figure 1:
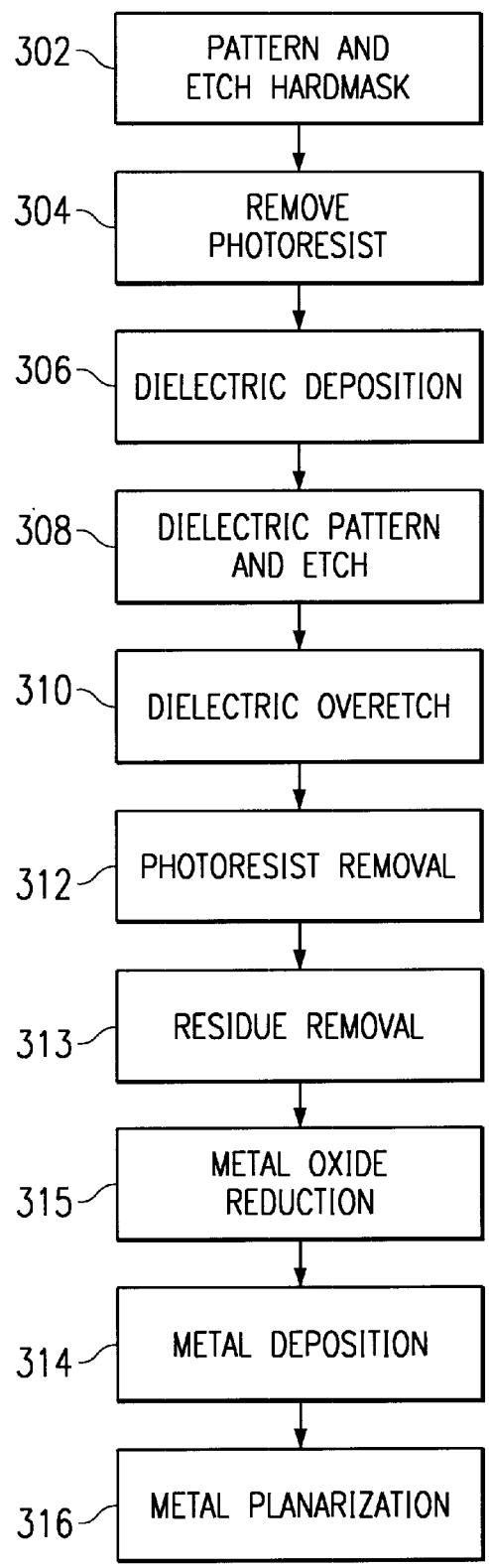
FIG. 1 is a flow diagram illustrating the method of an embodiment of the instant invention. This method is preferably utilized in a dual damascene process flow where oxygen-sensitive (metal) structures may be exposed (during the via etch process, preferably).

Common reference numerals are used throughout the figures to designate equivalent or substantially similar structures.

DETAILED DESCRIPTION OF THE DRAWINGS

While the methods of the instant invention are described with reference to FIGS. 1–2h, the methods of the instant invention can be applied to any type of device structure (e.g. metal interconnects, metal lines, metal gates, or other conductive structures) and to any type of device (e.g. memory devices, logic devices, power devices, DSPs, or microprocessors). In addition, the method of the instant invention can be used to remove residue from other device structures. Furthermore, while the methods of the instant invention, as described below, revolve around the use of hydrogen plasma, other plasmas may be used (such as a deuterium plasma, or other hydrogen-containing plasmas, such as $NH_3$, $N_2H_2$, $H_2S$ and $CH_4$, and deuterated forms of these gases, for example).

The following method of one embodiment of the instant invention should preferably be used in a process flow where there are exposed portions of oxygen-sensitive conductive structures and/or oxygen sensitive dielectric materials.

Figure 2A:
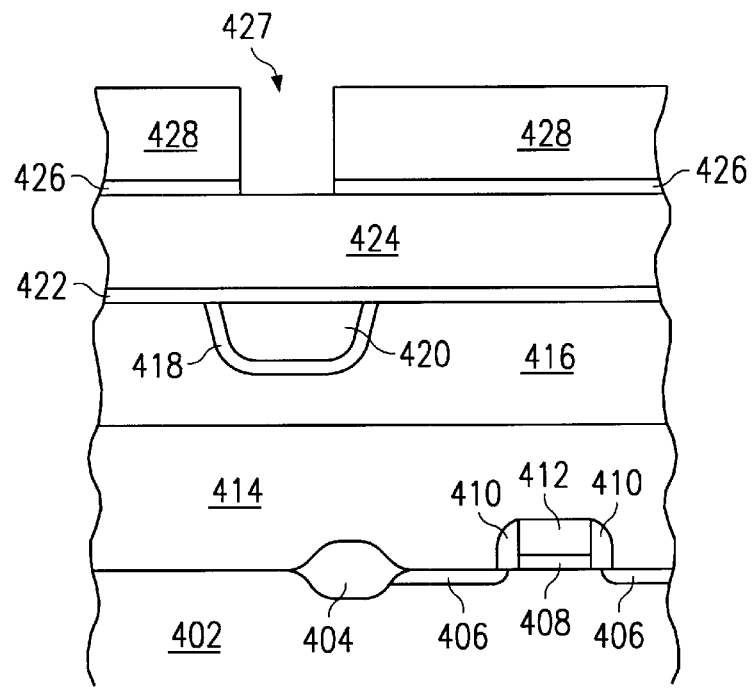
FIGS. 2a–2h are cross-sectional views of a semiconductor device which is fabricated using the method of the instant invention (which is illustrated in FIG. 1), incorporated into a dual damascene process flow where oxygen sensitive metal is exposed (during the via etch process, preferably).

Referring to step 302 of FIG. 1 and FIG. 2a, after providing substrate 402, isolation region 404 (which could be formed using LOCOS, field oxidation, or shallow trench isolation techniques), source/drain regions 406, gate dielectric 408, conductive gate structure 412, sidewall insulators 410, dielectric layer 414 (preferably comprised of BPSG, PSG, silicon oxide, oxide/nitride stack, TEOS, a low dielectric constant material, or any other interlevel dielectric material—in fact, regions 414 and 416 can be one layer) liner/barrier layer 418 (preferably comprised of Ti, TiN, Ti/TiN stack, Ta, TaN, or a Ta/TaN stack), conductor 420 (preferably comprised of aluminum, copper, copper-doped aluminum, or any other refractory metal), barrier layer 422 (preferably comprised of silicon nitride), dielectric layer 424 (preferably comprised of FSG, BPSG, PSG, TEOS, aerogel, xerogel, HSQ or any other low dielectric constant material), photoresist layer 428 is formed and patterned over hardmask layer 426. Preferably, hardmask layer 426 is comprised of an oxide, an oxide/nitride stack, or silicon nitride (most preferably, it is comprised of a nitride). Using the photoresist as a mask, hardmask 426 is etched so as to create opening 427 in the hardmask. Opening 427 is preferably aligned with underlying metal structure 420.

Figure 2B:
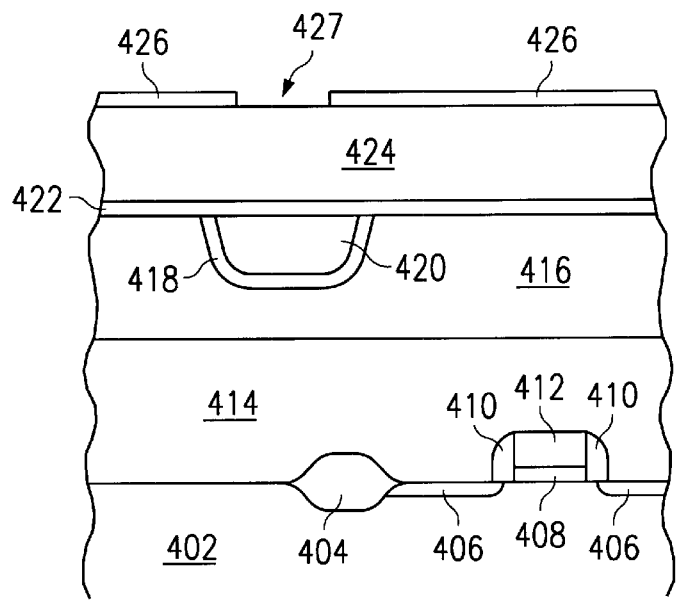

Referring to step 304 of FIG. 1 and FIG. 2b, photoresist 428 is removed. This may be accomplished by using a traditional oxygen ash step followed by a clean-up step, but is preferably done (in the case of oxygen sensitive metallization—specifically, copper metallization) by subjecting the wafer to a hydrogen-containing plasma so as to remove the photoresist and any residue. Preferably, the wafer temperature during this step is on the order of 150 to 350° C. (more preferably around 240 to 250° C.). While a hydrogen plasma is preferable, one or more forming gases (such as $N_2$ or Ar) can be added and/or deuterium or other hydrogen-containing gases such as $NH_3$, $N_2H_2$, $H_2S$, or $CH_4$, or deuterated forms of these gases, for example, may be used instead of hydrogen. A subsequent clean-up step can be performed but it is not necessary.

Figure 2C:
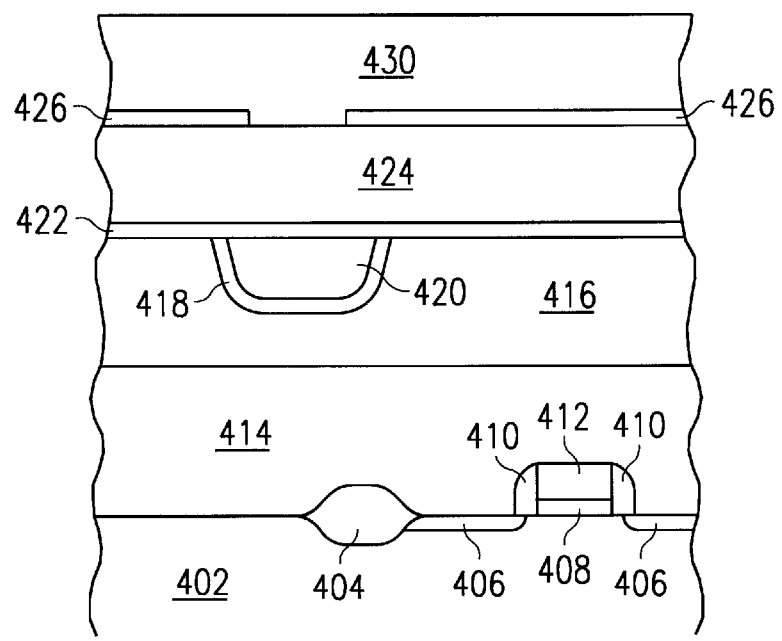

Referring to step 306 of FIG. 1 and FIG. 2c, a dielectric material is formed on hardmask 426. Preferably, dielectric layer 430 is comprised of TEOS, FSG, BPSG, PSG, HSQ, or a low dielectric constant material, such as aerogel, xerogel, or a polymer (such as fluorinated parylene). Dielectric layer 430 is preferably either spun on or deposited using chemical vapor deposition (CVD).

Figure 2D:
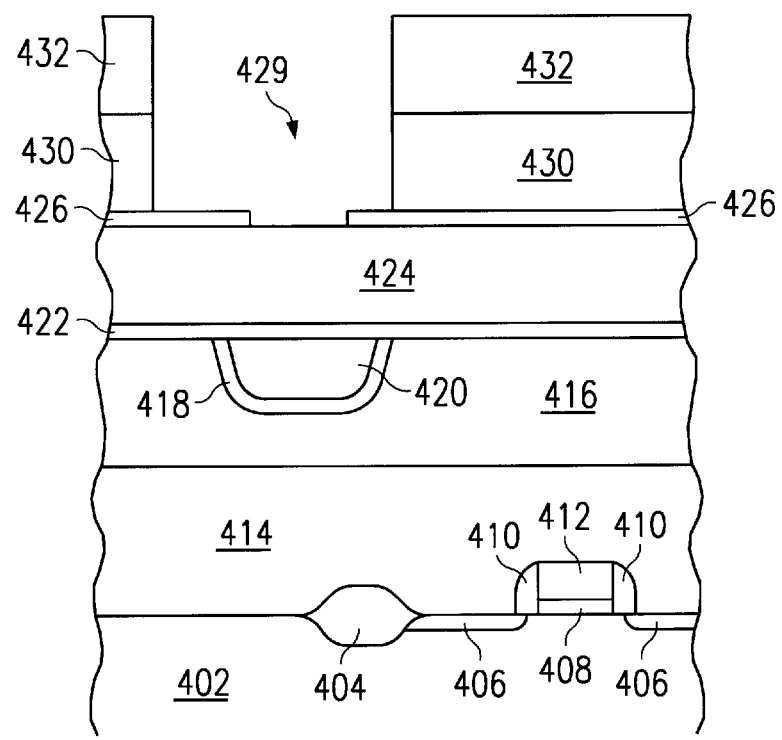
Figure 2E:
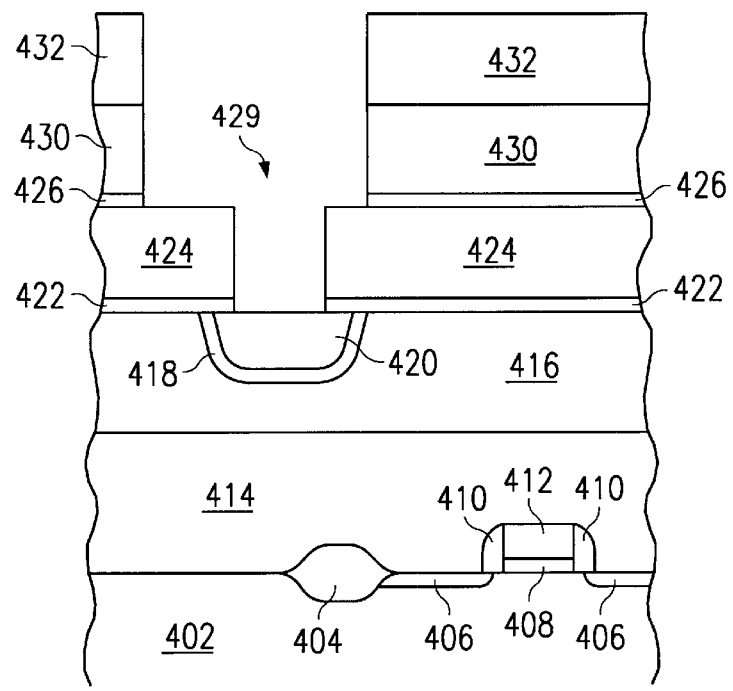

Referring to step 308 of FIG. 1 and FIG. 2d, photoresist layer 432 is formed with a pattern. This is followed by an etch process to remove the exposed portions of dielectric layers 430 and 424, and create trench/via opening 429. Preferably, this etch process is an anisotropic process, and, more preferably, it is performed using $CHF_3$, $CF_4$ or other fluorinated hydrocarbon plasma chemistry. Referring to step 310 of FIG. 1 and FIG. 2e, an overetch process is performed to ensure completion of the dielectric etch and consequently the via formation. During this processing, portions of barrier layer 422 may be removed thereby exposing the metal (Cu) layer 420.

Figure 2F:
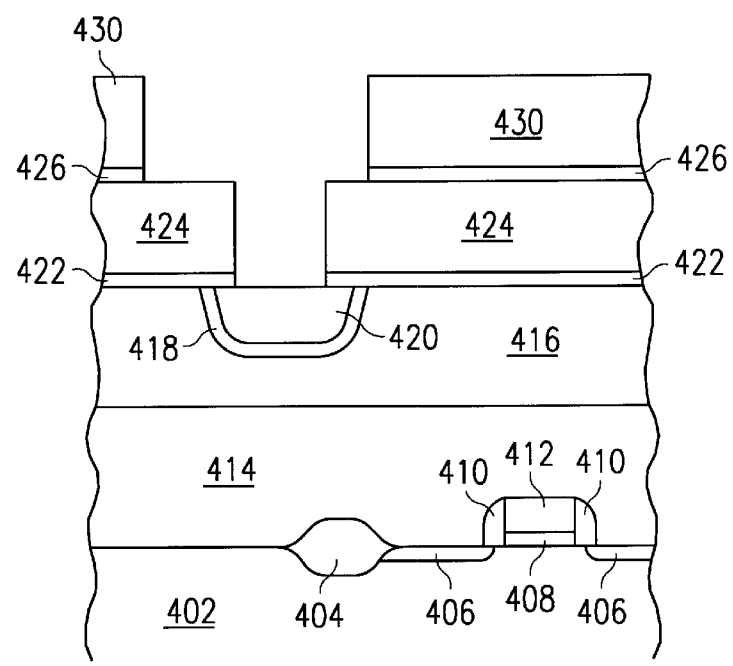

Referring to step 312 of FIG. 1 and FIG. 2f, photoresist 432 is removed. For oxygen sensitive metals such as Cu, this may be accomplished by using the method illustrated in co-pending application Ser. No. 09/199,829 (TI-25250). The traditional oxygen photoresist strip step should not be performed in this case, or if the exposed dielectric material is oxygen sensitive. Thus, the wafer should be subjected to a hydrogen-containing plasma so as to remove the photoresist. Preferably, the wafer temperature during this step is on the order of 150 to 350° C. (more preferably around 240 to 250° C.). While a hydrogen plasma is preferable, one or more forming gases (such as $N_2$ or Ar) can be added and/or deuterium or other hydrogen-containing plasmas, such as $NH_3$, $N_2H_2$, $H_2S$, or $CH_4$, or deuterated forms of these gases, for example, may be used instead of hydrogen.

A subsequent clean-up step (step 313) is preferably performed, next, so as to remove any polymer that is formed on the sidewalls of the via or the trench, on the underlying metal 420, on the surface of the dielectric 430, and any remaining portions of barriers 422 and 426. The preferable clean-up step 313 would include the method of the instant invention. More specifically, the wafer would be subjected to a plasma which contains $O_2$ and $CF_4$ (or other fluorocarbon, such as $C_2F_6$, or $CHF_3$, $CH_2F_2$, or other fluorine-containing hydrocarbon) at a wafer temperature around 25 to 400 C. (more preferably around 25 to 250 C.—even more preferably around 25 C. The low temperature $O_2/CF_4$ process would be preferable to a higher temperature process due to the fact that a thinner oxide would form on the exposed portions of metal 420. This clean-up step of the instant invention will remove any hydrocarbon residue left on metal structure 420. However, if portions of barrier 422 are removed during prior processing the underlying metal structure 420 will become oxidized during this step. Therefore, it is preferable to limit the time and temperature of this step so that the underlying metal structure 420 does not become appreciably oxidized. If the temperature is around 245 C., the processing time should be on the order of 15 to 60 seconds (more preferably around 30 seconds). The exact time and temperature are dependent upon one another and the processing equipment used. More specifically, if the temperature is increased the processing time must be decreased. Application of this process at room temperature may lead to minimal further metal oxidation. The ultimate goal for step 313 is to remove the residue without oxidizing underlying oxygen-sensitive metal 420 to the point where the second step of the instant invention (step 315) can not appreciably reduce the oxidation of metal 420.

In order to render underlying metal structure 420 more conductive (if it was oxidized), step 315 is performed to chemically reduce the metal oxides. Preferably this is accomplished by subjecting the wafer to a plasma which includes hydrogen, deuterium, or a hydrogen-containing substance. The wafer temperature during step 315 is preferably on the order of 100 to 400 C. (more preferably around 200 to 350 C.—even more preferably around 245 C.), and the processing time is greater than 120 seconds (more preferably greater than or equal to 180 seconds). The time required increases for decreasing processing temperature and vice versa. The ultimate goal of step 315 is to reduce the portions of metal structure 420 which where converted to oxide ($CuO_x$ where x is around ½ or 1 in the case of copper metallization). Most likely, step 315 results in the liberation of the oxygen from structure 420 by the formation of water vapor when the hydrogen contacts the oxygen.

Before step 314, the etch stop layer 422, and whatever remains of layer 426 should be completely removed to allow the metal 420 to contact the liner 434 and consequently the next metal level 436. Following the removal of layer 422 the surface of the metal 420 should be thoroughly cleaned to assure good contact between metal 420 and the liner 434. The clean of metal 420 is accomplished by the method of the present invention described in the previous paragraphs. A fluorinated oxygen plasma is used to remove polymer/residues from the exposed surfaces. The duration and process conditions of this step are selected to minimize the oxidation of the exposed metal 420 while still being aggressive enough to remove the residues/polymers. In a second step a reducing ambient plasma is used to convert the oxidized portion of metal 420 back to its metallic state.

Figure 2G:
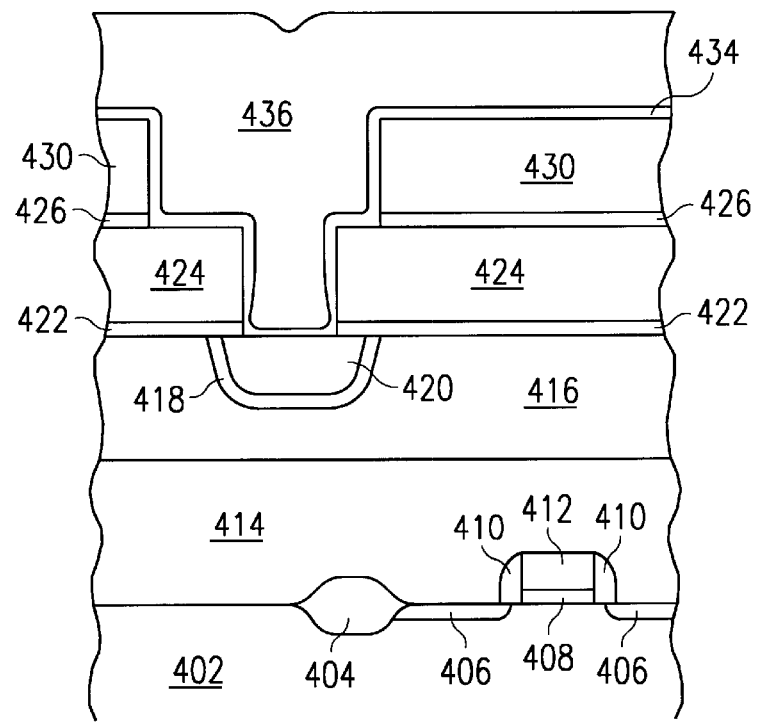

Referring to step 314 of FIG. 1 and FIG. 2g, a metal or other conductive material is formed over the liner 434. Liner layer 434 is preferably comprised of Ti, TiN, Ti/TiN stack, Ta, TaN, or a Ta/TaN stack. Preferably, metal layer 436 is comprised of aluminum, copper, copper-doped aluminum (preferably on the order of 0.5 to 5%; more preferably on the order of 1 to 2%), or any other refractory metal. Metal layer 436 is preferably formed by electroplating, PVD or CVD or a combination thereof.

Figure 2H:
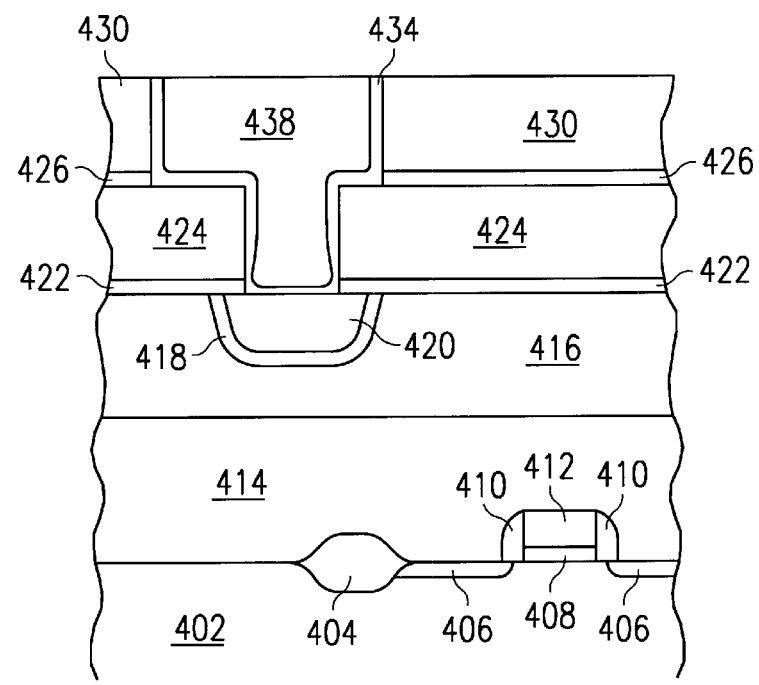

Referring to step 316 of FIG. 1 and FIG. 2h, metal structure 436 is planarized so as to form via and conductive line 438. Preferably, this planarization step is accomplished by CMP or a blanket etch-back step. The portion of liner/barrier 434 which is situated above dielectric 430 may be removed during this step, or it can be removed in a subsequent step.

While FIGS. 1–2h illustrate a dual damascene process, the instant invention can be used on any type of damascene process or any other type of metallization process. One of ordinary skill in the art should be able to extrapolate the use of the instant invention in many different types of structure formation schemes based on his or her knowledge and the teachings in the instant specification.

While the embodiments of the instant invention are described above with regards to removing residue from metallic structures, the instant invention is equally applicable to removing residue from the sidewalls and other exposed portions of the dielectric layer. More specifically, residue, which is produced by the reaction of the photoresist with the fluorine-containing chemistry (used to etch the openings in the dielectric layers—preferably comprising an oxide) forms both on the underlying metallic structure and on the exposed portions of the dielectric layer and is readily removed using any of the embodiments of the instant invention. Hence, when vias or openings are formed in the dielectric layers (which are covered with patterned photoresist), residues form on the sidewalls of the vias/openings in the dielectric layer and on the surface of the exposed dielectric, and on the portion of the underlying conductor which is exposed by this newly formed via/opening in the dielectric layer. This residue can be removed by the methods of the instant invention.

Although specific embodiments of the present invention are herein described, they are not to be construed as limiting the scope of the invention. Many embodiments of the present invention will become apparent to those skilled in the art in light of the methodology of the specification. The scope of the invention is limited only by the claims appended.

What we claim is:

1. A method of fabricating an electronic device formed on a semiconductor wafer, said method comprising the steps of:

forming a conductive structure over said semiconductor wafer, said conductive structure comprised of an oxygen-sensitive conductor;

forming a layer of dielectric material over said conductive structure;

forming a photoresist layer over said layer of said dielectric material;

patterning said layer of said dielectric material;

removing said photoresist layer after patterning said layer of said dielectric material;

subjecting said semiconductor wafer to a plasma which incorporates oxygen and a substance selected from the group consisting of: $CF_4$, $C_2F_6$, $CHF_3$, $CFH_3$, another fluorine-containing hydrocarbon, and any combination thereof; and reducing oxides formed in said conductive structure by subjecting said semiconductor wafer to a plasma which incorporates a gas which includes hydrogen or deuterium.

2. The method of claim 1, wherein said step of removing said photoresist layer is performed by subjecting said semiconductor wafer to a plasma which incorporates a gas which includes hydrogen or deuterium.

3. The method of claim 2, wherein said plasma in said step of removing said photoresist layer also includes $NH_3$, $N_2H_2$, $H_2S$, $CH_4$ or deuterated forms of these gases.

4. The method of claim 1, where said oxygen-sensitive material is comprised of a material selected from the group consisting of: copper, tantalum, tantalum nitride, titanium, titanium nitride, titanium silicide, tungsten, tungsten nitride, tungsten silicide, aluminum, copper-doped aluminum, silver, gold, ruthenium, ruthenium oxide, iridium, platinum, cobalt, cobalt silicide, and any combination thereof.

* * * * *